(12) United States Patent
Casteel, Jr. et al.

(10) Patent No.: US 10,332,784 B2
(45) Date of Patent: Jun. 25, 2019

(54) SELECTIVELY REMOVING TITANIUM NITRIDE HARD MASK AND ETCH RESIDUE REMOVAL

(71) Applicant: Air Products and Chemicals, Inc., Allentown, PA (US)

(72) Inventors: William Jack Casteel, Jr., Fountain Hill, PA (US); Seiji Inaoka, Macungie, PA (US); Wen Dar Liu, Chupei (TW); Tianniu Chen, Westford, MA (US)

(73) Assignee: VERSUM MATERIALS US, LLC, Tempe, AZ (US)

( * ) Notice: Subject to any disclaimer, the term of this patent is extended or adjusted under 35 U.S.C. 154(b) by 37 days.

(21) Appl. No.: 15/077,374

(22) Filed: Mar. 22, 2016

(65) Prior Publication Data

US 2016/0293479 A1 Oct. 6, 2016

Related U.S. Application Data

(60) Provisional application No. 62/140,846, filed on Mar. 31, 2015.

(51) Int. Cl.
| | | |
|---|---|---|
| *C09K 13/00* | (2006.01) | |
| *H01L 21/768* | (2006.01) | |
| *C09K 13/04* | (2006.01) | |
| *C23F 1/14* | (2006.01) | |
| *C09K 13/08* | (2006.01) | |
| *C09K 13/06* | (2006.01) | |
| *C23F 1/38* | (2006.01) | |
| *H01L 21/3213* | (2006.01) | |
| *H01L 21/311* | (2006.01) | |

(52) U.S. Cl.
CPC ........ *H01L 21/76814* (2013.01); *C09K 13/04* (2013.01); *C09K 13/06* (2013.01); *C09K 13/08* (2013.01); *C23F 1/14* (2013.01); *C23F 1/38* (2013.01); *H01L 21/32134* (2013.01); *H01L 21/31144* (2013.01)

(58) Field of Classification Search
CPC ........ C09K 13/04; C09K 13/06; C09K 13/08; C23F 1/14; C23F 1/18; C23F 1/20; C23F 1/38; H01L 21/32134
USPC ............... 252/79.1, 79.3, 79.4; 438/745, 754
See application file for complete search history.

(56) References Cited

U.S. PATENT DOCUMENTS

| | | | |
|---|---|---|---|
| 7,479,474 B2 | 1/2009 | Cerat et al. | |
| 9,222,018 B1 | 12/2015 | Casteel, Jr. et al. | |
| 2009/0131295 A1 | 5/2009 | Cui | |
| 2013/0157472 A1 | 6/2013 | Cui | |
| 2013/0244444 A1* | 9/2013 | Mizutani | C09K 13/08 438/756 |
| 2013/0257472 A1 | 10/2013 | Kamieniecki | |
| 2015/0087148 A1* | 3/2015 | Kim | H01L 21/30604 438/669 |
| 2015/0247087 A1 | 9/2015 | Kamimura et al. | |
| 2016/0185595 A1* | 6/2016 | Chen | H01L 21/02063 216/13 |

FOREIGN PATENT DOCUMENTS

| | | |
|---|---|---|
| CN | 103668206 A | 3/2014 |
| EP | 3024016 A1 | 5/2016 |
| WO | 2013101907 A1 | 7/2013 |
| WO | 2014065138 A1 | 5/2014 |
| WO | 2014077320 A1 | 5/2014 |
| WO | 2014138064 A1 | 9/2014 |
| WO | 2015017659 A1 | 2/2015 |

OTHER PUBLICATIONS

Wikipedia "Parts-per notation" via https://en.wikipedia.org/wiki/Parts-per_notation ; pp. 1-11, 2017.*
Dissociation Equations via http://fc.gsacrd.ab.ca/~aaron_fidler/S018D6CFB-018D6CFB.2/ ; pp. 1-3; No date available.*
"Chem 101 Reactions in Aqueous Solutions" via https://pdfs.semanticscholar.org/presentation/2b32/6392ec352eaf30096e4c15b2ddcf9658ea2f.pdf ; pp. 1-28; No date available.*
Wikipedia "Hexafluorosilicic acid" via https://web.archive.org/web/20130904225722/http://en.wikipedia.org/wiki/Hexafluorosilicic_acid ; pp. 1-5, 2013.*
Chemical Book, "Ammonium fluoroborate" via https://web.archive.org/web/20120605055234/http://www.chemicalbook.com/ChemicalProductProperty_EN_CB8731252.htm ; pp. 1-3; 2012.*
Lippy, S., et al., "TiN Metal Hard Mask Removal with Selectivity to Tungsten and TiN Liner", ECS Transactions, vol. 58, No. 6, Aug. 31, 2013, pp. 261-266.

* cited by examiner

*Primary Examiner* — Binh X Tran
(74) *Attorney, Agent, or Firm* — Lina Yang

(57) ABSTRACT

Formulations for stripping titanium nitride hard mask and removing titanium nitride etch residue comprise an amine salt buffer, a non-ambient oxidizer, and the remaining being liquid carrier includes water and non-water liquid carrier selected from the group consisting of dimethyl sulfone, lactic acid, glycol, and a polar aprotic solvent including but not limited to sulfolanes, sulfoxides, nitriles, formamides and pyrrolidones. The formulations have a pH <4, preferably <3, more preferably <2.5. The aqueous formulations having water as liquid carrier and semi-aqueous formulation having water and non-polar aprotic solvent(s) further contain acidic fluoride. The formulations offer high titanium nitride etch rates while provide excellent compatibility towards W, AlN, AlO, and low k dielectric materials. The formulations may comprise weakly coordinating anions, corrosion inhibitors, and surfactants. Systems and processes use the formulations for stripping titanium nitride hard mask and removing titanium nitride etch residue.

11 Claims, No Drawings

SELECTIVELY REMOVING TITANIUM NITRIDE HARD MASK AND ETCH RESIDUE REMOVAL

This Application claims the benefit of U.S. Provisional Application No. 62/140,846, filed on Mar. 31, 2015. The disclosure of this Application is hereby incorporated by reference.

BACKGROUND OF THE INVENTION

As scaling continues to ever smaller feature sizes, integrated circuit (IC) reliability is an increasing concern in IC fabrication technology. The impact of trace interconnect failure mechanisms on device performance and reliability demand much more from integration schemes, interconnect materials, and processes. An optimal low-k dielectric material and its related deposition, pattern lithography, etching and cleaning are required to form dual-damascene interconnect patterns. A hard-mask scheme approach of interconnects-patterning wafer fabrication is the ability to transfer patterns into under layers with tightest optimal dimension control.

As technology nodes advance to nanotechnology, metal hard-mask materials such as TiN are used to gain better etching/removal selectivity, better pattern retention and profile control to the low-k materials during the pattern etching process.

Formulations have been developed to pullback or remove these types of metal hard-masks from substrates.

The following patents are representatives.

US2013/0157472 describes the formulations comprising Cl⁻, or Br⁻ an oxidizer and potentially a Cu corrosion inhibitor to clean substrates containing low-k dielectric and Cu and to etch a TiN or TiNxOy hardmask and tungsten. The formulation typically contains 6% hydrogen peroxide as the oxidizer and diglycolamine to adjust the pH to >7.

US 2009/0131295 A1 describes the removal of hard mask residues (typically TiF containing) after plasma etch from TiN at a pH of 1-8 using acidic or basic fluoride or bifluoride.

U.S. Pat. No. 7,479,474 B2 describes cleaning formulations comprising $H_2SiF_6$ or $HBF_4$ to reduce oxide etch in a substrate comprising low-K dielectric.

WO 2013/101907 A1 describes formulations comprising etchants including hexafluorosilicic acid and hexafluorotitanate, at least one oxidant including high valent metals, peroxide or high oxidation state species and at least one solvent.

BRIEF SUMMARY OF THE INVENTION

The present invention relates to composition, system and process for selectively etching hard mask layers and/or etch residues relative to metal conductor layers and low-k dielectric layers that are present. More specifically, the present invention relates to a composition, system and process for selectively etching a Titanium nitride hard mask and/or etch residues relative to tungsten, copper and low-k dielectric layers.

In one aspect, a composition for selectively removing titanium nitride (TiN or TiNxOy; where x>0 to 1.3 and y=0 to 2) from a semiconductor device comprising TiN or TiNxOy and a second material; the composition comprising:
an amine salt buffer;
a non-ambient oxidizer; and
liquid carrier;
wherein
the composition comprises no hydrogen peroxide;
the composition has a pH<4, preferably <3, more preferably <2.5;
the second material is selected from the group consisting of Cu, W, aluminum nitride (AlNx with x=0.5 to 1), aluminum oxide (AlOx with x=1 to 1.5), low-k dielectric material, and combinations thereof
and
the composition offers a removal selectivity of TiN or TiNxOy vs. the second material >1:1, preferably >5:1, and more preferably >10:1.

In another aspect, a system for selectively removing titanium nitride (TiN or TiNxOy, where x>0 to 1.3 and y=0 to 2) from a surface of a microelectronic device, comprising:
the semiconductor device comprising TiN or TiNxOy and a second material,
a composition for selectively removing the TiN or TiNxOy from the semiconductor device comprising:
an amine salt buffer;
a non-ambient oxidizer; and
liquid carrier;
wherein
the composition comprises no hydrogen peroxide;
the composition has a pH<4, preferably <3, more preferably <2.5;
the second material is selected from the group consisting of Cu, W, aluminum nitride (AlNx with x=0.5 to 1), aluminum oxide (AlOx with x=1 to 1.5), low-k dielectric material, and combinations thereof; and
the composition offers a removal selectivity of TiN or TiNxOy vs. the second material >1:1, preferably >5:1, and more preferably >10:1.

In yet another aspect, a process of selectively removing titanium nitride (TiN or TiNxOy, where x>0 to 1.3 and y=0 to 2) comprising:
providing a semiconductor device comprising TiN or TiNxOy and a second material;
contacting the semiconductor device with a composition comprising:
an amine salt buffer;
a non-ambient oxidizer; and
liquid carrier;
wherein
the composition comprises no hydrogen peroxide;
the composition has a pH<4, preferably <3, more preferably <2.5;
the second material is selected from the group consisting of Cu, W, aluminum nitride (AlNx with x=0.5 to 1), aluminum oxide (AlOx with x=1 to 1.5), low-k dielectric material, and combinations thereof; and
selectively removing TiN or TiNxOy; and removal selectivity of TiN or TiNxOy vs. the second material is >1:1, preferably >5:1, and more preferably >10:1.

The amine salt buffer includes but is not limited to ammonium chloride; ammonium bisulfate; ammonium phosphates; ammonium oxalate; ammonium perfluorosulfonates; ammonium tetrafluoroborate; ammonium hexafluorotitanate; ammonium hexafluorosilicate; ammonium salts of organic acid selected from ammonium citrate, ammonium acetate, ammonium lactate; and combinations thereof;
wherein the ammonium having a form of $N(R^1R^2R^3R^4)^+$;
wherein $R^1$, $R^2$, $R^3$, $R^4$ is independently selected from the group consisting of H, $CH_3$, $C_2H_5$, and $C_3H_7$.

A non-ambient oxidizer includes but is not limited to salts of persulfates including but not limited to sodium persulfate, ammonium persulfate; salts of iodate; salts of periodate; Cl(I, III or V) compounds; Br(I, III or V) compounds; and combinations thereof.

The liquid carrier includes but is not limited to water and non-water liquid carrier selected from the group consisting of dimethyl sulfone, lactic acid, glycol, and a polar aprotic solvent including but not limited to sulfolanes, sulfoxides, nitriles, formamides and pyrrolidones. Specific examples of polar aprotic solvent include but are not limited to sulfolane, acetonitrile, dimethylformamide and N-methylpyrrolidone.

The composition can be aqueous when the liquid carrier is water. The aqueous composition further comprises acidic fluoride.

The composition can be semi-aqueous when it contains water and at least one non-water liquid carrier. The semi-aqueous composition can further comprises acidic fluoride when the non-water liquid carrier is not a polar aprotic solvent.

The acidic fluoride includes but is not limited to ammonium bifluoride, alkylammonium bifluoride or aqueous hydrogen fluoride itself, fluorosilicic acid, fluoroboric acid, acids of hydrated fluoroaluminates, and combinations thereof. The compositions may further comprise a weakly coordinating anion having negative charge highly dispersed throughout its structure, corrosion inhibitor, and surfactant The weakly coordinating anion includes but is not limited to p-toluenesulfonate ($C_7H_8SO_3^-$), sulfate ($SO_4^{2-}$), nitrate ($NO_3^-$), triflate($CF_3SO_3^-$), fluorosulfate, perfluorosulfonates ($R_fSO_3^-$; $R_f$ is a perfluoroalkylgroup from C1 to C4), perfluorosulfonimides; ($(R_f)_2NSO_2^-$; where $R_f$ is a perfluoroalkylgroup from C1 to C4), hexafluorosilicate ($SiF_6^{2-}$), hexafluorotitanate ($TiF_6^{2-}$), tetrafluoroborate ($BF_4^-$), hexafluorophosphate ($PF_6^-$), hexafluoroantimonate ($SbF_6^-$), perfluoroalkylaluminates ($(R_fO)_4Al^-$, $R_f$ is a perfluoroalkyl group), and combinations thereof.

Other aspects, features and embodiments of the invention will be more fully apparent from the ensuing disclosure and appended claims.

DETAILED DESCRIPTION OF THE INVENTION

In general, the present invention relates to compositions, systems and processes for selectively etching hard mask layers and/or photoresist etch residues relative to metal conductor layers and low-k dielectric layers that are present. Specifically, this invention describes compositions, systems and processes with good removal rate for titanium nitride hard mask material (TiN or TiNxOy, where x>0 to 1.3 and y=0 to 2), called TiN hard mask material for simplicity hereafter; without damage to the metal 1 layer (M1) (such as tungsten) and other M1 level components including low k dielectric materials, and in some cases aluminum nitride (AlNx with x=0.5 to 1), aluminum oxide (AlOx with x=1 to 1.5) dielectric layers.

Compositions, or formulations (compositions, formulations are used exchangeable in present invention) designed for the removal of titanium nitride hard mask materials (TiN or TiNxOy, where x>0 to 1.3 and y=0 to 2) after wafer patterning typically use hydrogen peroxide as an oxidant. The terms "formulation" and "composition" as used herein, are used interchangeably.

Chemistries involving hydrogen peroxide as an oxidizing agent for Titanium nitride hard mask removal have proven effective, but appear to be incompatible with tungsten metal in the M1 layer of the wafer. The formulations often etch tungsten even more readily than the desired TiN hard mask.

When hydrogen peroxide is used as an oxidant under slightly basic conditions to solubilize the titanium nitride as titanium peroxide species, unfortunately the M1 level metal, such as tungsten, also readily forms soluble peroxides and is attacked by these chemistries.

The chemistry of this invention avoids the use of hydrogen peroxide. That is, this invention, more specifically, describes a new, hydrogen peroxide-free, platform of strippers (formulations) for Titanium nitride hard mask removal on 28 nm wafers and smaller nodes. This aspect of the invention makes the chemistry much more compatible with tungsten.

Air at atmospheric conditions is an example of a mild ambient oxidizer. The term non-ambient oxidizer includes any oxidizer that is not air or oxygen in air.

Unless specified, air at atmospheric conditions is normally present during tool operation, a mild ambient oxidizer is considered be present for the formulations.

The invention operates at a low pH<4, preferably <3, and more preferably <2.5. The formulation can be both aqueous (those containing water only) and semi-aqueous (those containing water and at least one non-water liquid carrier) formulations. The formulations comprise an amine salt buffer, a non-ambient oxidizer, an acidic fluoride source, and liquid carrier to remove the titanium nitride hard mask without etching tungsten. Nor does this chemistry etch the TiN liner between the tungsten and low-k dielectric layers. The amine salt buffer is used to maintain the pH of the formulation below 4, preferably <3, and more preferably <2.5. The non-ambient oxidizer and acidic fluoride are used to efficiently remove TiN.

The formulations contain an amine salt buffer. The amine salt buffer may include, but is not limited to, ammonium chloride, ammonium bisulfate, ammonium phosphates, ammonium oxalate, ammonium perfluorosulfonates, ammonium tetrafluoroborate, ammonium hexafluorotitanate or ammonium hexafluorosilicate (which may be formed from ammonium hydroxide and hexafluorosilicic acid), or ammonium salts of organic acids, including but not limited to ammonium citrate, ammonium acetate, ammonium lactate, and combinations thereof.

By ammonium is meant a salt of any amine of the form $N(R^1R^2R^3R^4)^+$ where $R^1$, $R^2$, $R^3$, $R^4$ may all be the same or different or and may constitute H, $CH_3$, $C_2H_5$, $C_3H_7$.

The amount of the amine salt buffer is in the range of 0.5-10 wt %, preferably 1-10 wt % and more preferably 2-8 wt %.

The formulations contain a non-ambient oxidizer including but not limited to salts of persulfates including but not limited to sodium persulfate, ammonium persulfate, salts of iodate, salts of periodate, Cl(I, III or V) compounds, Br(I, III or V) compounds, and combinations thereof.

The non-ambient non-metal oxidizers are used in amounts ranging from 0.2 to 3 wt %, preferably from 0.5 to 2 wt % and more preferably from 0.5 to 1%.

The formulations contain an acidic fluoride which can be a solvolyzing acidic fluoride at quantities <4000 ppm, or <2000 ppm, or <500 ppm by weight, depending on the stability of the oxide, e.g., $O_3$-tetraethylorthosilicate (TEOS) layer, or other low-k dielectric layers.

The solvolyzing acidic fluoride may include, but is not limited to ammonium bifluoride, alkylammonium bifluoride or aqueous hydrogen fluoride itself, fluorosilicic acid, fluoroboric acid, and acids of hydrated fluoroaluminates.

The formulations also include a liquid carrier. The liquid carrier may include, but is not limited to water, and a non-water liquid carrier selected from the group consisting of dimethyl sulfone, lactic acid, glycol, and a polar aprotic solvent including but not limited to sulfolanes, sulfoxides, nitriles, formamides and pyrrolidones. Specific examples of polar aprotic solvent include but are not limited to sulfolane, acetonitrile, dimethylformamide and N-methylpyrrolidone. selected from the group consisting of sulfolane, dimethyl sulfone, lactic acid, glycols, such as propylene glycol and mixtures thereof.

The formulations may further contain a weakly coordinating anion in either the acidic form or an amine substituted form. The weakly coordinating anion is also used to maintain the pH of the formulation below 4 and preferably below 3; and more preferably below 2.5.

A weakly coordinating anion has negative charge highly dispersed throughout its structure and so is designed to stabilize and keep very reactive cations, such as those of dissolved titanium nitride, in aqueous formulation.

The weakly coordinating anion may include, but is not limited to, p-toluenesulfonate ($C_7H_8SO_3^-$), sulfate ($SO_4^{2-}$), nitrate($NO_3^-$), triflate($CF_3SO_3^-$), fluorosulfate, perfluorosulfonates ($R_fSO_3^-$; where $R_f$ is a perfluoroalkylgroup from C1 to C4), perfluorosulfonimides; (($R_f$)$_2$NSO$_3^-$; where $R_f$ is a perfluoroalkylgroup from C1 to C4), hexafluorosilicate ($SiF_6^{2-}$), hexafluorotitanate ($TiF_6^{2-}$), tetrafluoroborate ($BF_4^-$), hexafluorophosphate ($PF_6^-$), hexafluoroantimonate ($SbF_6^-$) and perfluoroalkylaluminates(($R_fO)_4Al^-$, where $R_f$ is a perfluoroalkyl group), and combinations thereof.

The amount of the weakly coordinating anion is in the range of 1-10 wt %, preferably 2-8 wt %, and more preferably 4-8 wt %

The formulations may contain corrosion inhibitors to improve compatibility to other metals.

The corrosion inhibitor may include, but is not limited to benzotriazole or substituted benzotriazole, polyethyleneimine, catechol, cysteine and cystine derivatives, glycine, thiourea and thiobiuret, siloxane, aluminum chloride, aluminum fluoride, imidazole, triazole and boric acid.

The corrosion inhibitor is used in amounts of <10000 ppm, preferably <5000 ppm and more preferably <1000 ppm by weight.

The formulations may also contain surfactants to improve wettability of wafer surfaces. Examples of surfactants include but are not limited to ammonium lauryl sulfate and a wide range of organic sulfates, including salts of p-toluene sulfate. The surfactant is typically used in quantities <1000 ppm, preferably <500 ppm and more preferably <100 ppm by weight.

The formulations of this invention offer the following advantages.
1. High rates of Titanium nitride etch are observed at 70° C. and lower.
2. Aqueous and semi-aqueous solutions of the formulations are stable.
3. Low active fluoride containing formulations show low TEOS etch and patterned PDEMs® 2.2 ILD film.
4. Low or essentially no etch of tungsten, W, is observed, so formulations of this platform are compatible with and may be used in cleaning the M1 layer.
5. The formulations do not damage the TiN liner between the tungsten and the low-k dielectric layers.
6. Semi-aqueous formulations show low aluminum nitride etch compared with other formulations.

Working examples have exhibited key features and benefits of present invention.

Working examples have exhibited key features and benefits of present invention.

WORKING EXAMPLES

Aqueous formulations were prepared by blending the components as described in Tables 1A. Semi-aqueous formulations were prepared as described in Table 1B.

Wafers of varying types of TiN, W, TEOS and typical inter-layer dielectric (ILD) materials, for example, patterned PDEMs 2.2, were immersed in the formulations with 500 rpm stirring and heating to between 40 and 70° C. Immersion times were varied depending on the etch rates.

Etch rates for metals were determined by determining film thicknesses before and after the etch process by sheet resistivity on a CDE RESMAP Model 273, table-top four point probe, manufactured by Creative Design Engineering, 20565 Alves Drive, Cupertino, Calif. 95014. Etch rates for the ILD and TEOS were measured by before and after thicknesses on a SCI FilmTeK Ellipsometer.

Aqueous formulations were shown in Table 1A.

TABLE 1A

|  | Assay | 92B 100 | 92D 100 | 92E 100 | 92F 100 | 92I 100 | 92J 100 | 92K 100 |
|---|---|---|---|---|---|---|---|---|
| De-ionized water | 100% | 94.5 | 89.5 | 91 | 91 | 94 | 91.5 | 91.25 |
| sodium persulfate | 100% | 2.5 | 2.5 | 1 | 1 | 1 | 0.5 | 0.75 |
| ammonium chloride | 100% | 3 | 3 | 0 | 3 | 0 | 3 | 3 |
| ammonium bisulfate | 100% | 0 | 0 | 3 | 0 | 0 | 0 | 0 |
| ammonium acetate | 100% | 0 | 0 | 0 | 0 | 3 | 0 | 0 |
| ammonium bifluoride | 10% | 0 | 0 | 0 | 0 | 2 | 0 | 0 |
| hydrofluoric acid | 5% | 0 | 5 | 5 | 5 | 0 | 5 | 5 |

Semi-aqueous formulations using non-water liquid carriers were shown in Table 1 B.

All formulations had a pH<4, except formulation 92I where the pH of the formulation was >4.

TABLE 1B

|  | Assay | 94A | 94B | 94C | 94D | 94E | 94F |
|---|---|---|---|---|---|---|---|
| De-ionized water | 100% | 67 | 47 | 68 | 57 | 67 | 37 |
| sodium persulfate | 100% | 1 | 1 |  |  |  |  |
| ammonium persulfate | 12% |  |  | 10 | 10 | 10 | 10 |
| ammonium chloride | 100% | 3 | 3 | 3 | 3 | 3 | 3 |
| hydrofluoric acid | 5% | 4 | 4 | 4 |  |  |  |
| sulfolane | 100% | 25 | 45 |  | 30 |  | 25 |
| dimethylsulfone | 100% |  |  | 15 |  | 20 | 25 |

TiN Stripping studies at 40-70° C. using the formulations were carried out in the following examples and comparative examples. Blend data in with other examples Example 1

Use of Persulfate Salts as Non-Ambient Oxidizers

The etch data at 45 and 50° C. for formulations shown in Table 1A and 1B were shown in Table 2.

Formulation 92A served as a comparative example in which hydrogen peroxide was used as the oxidant. The formulation contained 0.5% hydrogen peroxide as a non-ambient oxidant. This formulation was buffered to pH~4 with 3 wt % ammonium chloride. Minimal TiN etching was observed from formulation 92A, while significant etching of tungsten was observed.

Formulation 92B served as another comparative example in which the formulation contained non-ambient oxidizer (i.e. persulfate), but no acidic fluoride (i.e. trace bifluoride). The result from 92B has shown low TiN etch rates.

Formulation 92I also served as a comparative example where the pH of the formulation was >4. Formulation 92I offered a minimal TiN etch rate, rather a relative high W etch rate.

their good compatibility towards W, aluminum nitride (AlN), and low k dielectric materials.

The semi-aqueous formulations of present invention are extremely useful for systems where compatibility toward aluminum nitride or aluminum oxide is desired.

The foregoing examples and description of the preferred embodiments should be taken as illustrating, rather than as limiting the present invention as defined by the claims. As will be readily appreciated, numerous variations and combinations of the features set forth above can be utilized without departing from the present invention as set forth in the claims. Such variations were not regarded as a departure

TABLE 2

Etch Data for Persulfate formulations

| | PVD TiN Etch Rates (A/min) at 45 C. | W | Tin/W ratio | low k | AlN | PVD TiN Etch Rates (A/min) at 50 C. | W | Tin/W ratio | low k | AlN |
|---|---|---|---|---|---|---|---|---|---|---|
| 92A | | | | | | 3 | 100 | 0.03 | <1 | ND |
| 92B | | | | | | 2 | 6 | 0.33 | <1 | ND |
| 92D | | | | | | 130 | 20 | 6.50 | 3 | ND |
| 92E | | | | | | 174 | 10 | 17.40 | 4 | ND |
| 92F | 101 | 17 | 5.94 | <1 | >30 | 185 | 18 | 10.28 | 1 | ND |
| 92I | | | | | | 1 | 63 | 0.02 | <1 | ND |
| 92J | 98 | 8 | 12.25 | <1 | >60 | | | | | |
| 92K | 98 | 13 | 7.54 | <1 | >60 | | | | | |
| 94A | 73 | 18 | 4.06 | <1 | 11 | 80 | 13 | 6.15 | <1 | 34 |
| 94B | 72 | 23 | 3.13 | <1 | 15 | 80 | 18 | 4.44 | <1 | 40 |
| 94C | 84 | 15 | 5.60 | <1 | 7 | 102 | 12 | 8.50 | <1 | 33 |
| 94D | 60 | 6 | 10.00 | <1 | 1 | 79 | 12 | 6.58 | <1 | 20 |
| 94E | 60 | 10 | 6.00 | <1 | >30 | 101 | 13 | 7.77 | <1 | >33 |
| 94F | | | | | | 80 | 18 | 4.44 | <1 | >43 |

ND—Not determined
Low k—patterned PEDMs 2.2

The data from aqueous formulations 92D, E and F has shown that formulations of this invention containing non-ambient oxidizer (i.e. persulfate), and acidic fluoride (i.e. trace bifluoride) at a pH<4 were able to offer high TiN etch rates, while provided excellent compatibility towards W and low k dielectric materials. The formulations offered good selectivity of TiN vs W (up to 17) and TiN vs low k dielectric materials (up to >100).

For semi-aqueous formulations with the addition of non-water liquid carriers such as sulfolane (a polar aprotic solvent) or dimethyl sulfone, the data in Table 2 showed that the semi-aqueous formulations containing non-ambient oxidizer (i.e. persulfate) with or without an acidic fluoride (i.e. trace bifluoride) at a pH<4 were also able to offer high TiN etch rates while provided excellent compatibility towards W and low k dielectric materials. The formulations offered good selectivity of TiN vs W (up to 10) and TiN vs low k dielectric materials (up to >100).

Furthermore, the data in Table 2 also showed that semi-aqueous formulations containing acidic fluoride greatly reduced the aluminum nitride (AlN) etch rate, while maintaining good TiN vs W, and/or TiN vs low k dielectric etch selectivity at temperature <50° C. The formulations showed protection for the AlN layer.

Semi-aqueous formulation containing a polar aprotic solvent sulfolane as the only non-water liquid carrier in the absence of acidic fluoride (94D) greatly reduced the aluminum nitride (AlN) etch rate, while maintaining good TiN vs W, and/or TiN vs low k dielectric etch selectivity. The formulations showed protection for the AlN layer.

The formulations of present invention have demonstrated their effectiveness for the removal of the TiN hard mask, and from the spirit and scope of the invention, and all such variations were intended to be included within the scope of the following claims.

The invention claimed is:

1. A composition for selectively removing titanium nitride from a semiconductor device, the composition consisting of:
   an amine salt buffer selected from the group consisting of ammonium chloride and ammonium bisulfate;
   sodium persulfate;
   hydrofluoric acid;
   liquid carrier; and
   a weakly coordinating anion selected from the group consisting of p-toluenesulfonate ($C_7H_8SO_3^-$), sulfate ($SO_4^{2-}$), nitrate($NO_3^-$), triflate ($CF_3SO_3^-$), perfluorosulfonates ($R_fSO_3^-$; where $R_f$ is a perfluoroalkylgroup from C1 to C4), perfluorosulfonimides; (($R_f)_2NSO_2^-$; where $R_f$ is a perfluoroalkylgroup from C1 to C4), hexafluorosilicate($SiF_6^{2-}$), hexafluorotitanate ($TiF_6^{2-}$), tetrafluoroborate($BF_4^-$), hexafluorophosphate ($PF_6^-$), hexafluoroantimonate ($SbF_6^-$), perfluoroalkylaluminates(($R_fO)_4Al^-$, $R_f$ is a perfluoroalkyl group), and combinations thereof; and
   optionally, a corrosion inhibitor selected from the group consisting of benzotriazole, a substituted benzotriazole, polyethyleneimine, catechol, cysteine, a cystine derivative, glycine, thiourea, thiobiuret, siloxane, aluminum chloride, aluminum fluoride, imidazole, triazole, boric acid and combinations thereof,
   wherein
   the composition is free of hydrogen peroxide, and
   the composition has a pH<4.

2. The composition of claim 1, wherein the amine salt buffer is present in the range of 0.5 to 10 wt %.

3. The composition of claim 1, wherein the sodium persulfate is present in the range of 0.2 to 3 wt %.

4. The composition of claim 1, wherein the liquid carrier is water.

5. The composition of claim 1, wherein the composition is a semi-aqueous composition having liquid carrier consisting of water and dimethyl sulfone.

6. The composition of claim 1, wherein the pH of the composition is <3.

7. The composition of claim 1, wherein the weakly coordinating anion is present in the range of 1 to 10 wt %.

8. A process of selectively removing titanium nitride (TiN or TiNxOy, where x>0 to 1.3 and y=0 to 2) comprising:
providing a semiconductor device comprising TiN or TiNxOy and a second material;
contacting the semiconductor device with a composition according to claim 1 wherein
the second material is selected from the group consisting of Cu, W, aluminum nitride (AlNx with x=0.5 to 1), aluminum oxide (AlOx with x=1 to 1.5), low-k dielectric material, and combinations thereof; and
TiN or TiNxOy is in direct contact with the composition; and removal selectivity of TiN or TiNxOy vs. the second material is >1:1.

9. The process of claim 8, wherein the liquid carrier in the composition is water.

10. The process of claim 8, wherein the composition is a semi-aqueous composition having liquid carrier consisting of water and dimethyl sulfone.

11. The composition of claim 1, consisting of:
an amine salt buffer selected from the group consisting of ammonium chloride and ammonium bisulfate;
sodium persulfate;
hydrofluoric acid;
liquid carrier;
a weakly coordinating anion selected from the group consisting of p-toluenesulfonate ($C_7H_8SO_3^-$), sulfate ($SO_4^{2-}$), nitrate($NO_3^-$), triflate($CF_3SO_3^-$), perfluorosulfonates ($R_fSO_3^-$; where $R_f$ is a perfluoroalkylgroup from $C_1$ to $C_4$), perfluorosulfonimides; (($R_f$)$_2$NSO$_2^-$; where $R_f$ is a perfluoroalkylgroup from C1 to C4), hexafluorosilicate($SiF_6^{2-}$), hexafluorotitanate ($TiF_6^{2-}$), tetrafluoroborate($BF_4^-$), hexafluorophosphate ($PF_6^-$), hexafluoroantimonate ($SbF_6^-$), perfluoroalkylaluminates(($R_fO$)$_4$Al$^-$, $R_f$ is a perfluoroalkyl group), and combinations thereof,
wherein
the composition has a pH<4.

* * * * *